United States Patent
Ieki et al.

(10) Patent No.: US 8,072,769 B2
(45) Date of Patent: Dec. 6, 2011

(54) COMPONENT-EMBEDDED MODULE AND MANUFACTURING METHOD THEREOF

(75) Inventors: Tsutomu Ieki, Moriyama (JP); Kazuyuki Yuda, Suita (JP)

(73) Assignee: Murata Manufacturing Co., Ltd., Kyoto (JP)

(*) Notice: Subject to any disclaimer, the term of this patent is extended or adjusted under 35 U.S.C. 154(b) by 180 days.

(21) Appl. No.: 12/579,617

(22) Filed: Oct. 15, 2009

(65) Prior Publication Data

US 2010/0027225 A1     Feb. 4, 2010

Related U.S. Application Data

(63) Continuation of application No. PCT/JP2008/057155, filed on Apr. 11, 2008.

(30) Foreign Application Priority Data

May 2, 2007   (JP) .................................. 2007-121412

(51) Int. Cl.
*H05K 1/18* (2006.01)
(52) U.S. Cl. ......... 361/761; 361/763; 361/764; 361/766
(58) Field of Classification Search ......... 361/761–766, 361/795, 803
See application file for complete search history.

(56) References Cited

U.S. PATENT DOCUMENTS

| | | | |
|---|---|---|---|
| 5,926,379 A | 7/1999 | Cadet et al. | |
| 7,315,455 B2* | 1/2008 | Furukawa et al. | 361/760 |
| 7,885,081 B2* | 2/2011 | Kawagishi et al. | 361/761 |
| 2002/0052062 A1 | 5/2002 | Sakamoto et al. | |
| 2004/0105243 A1 | 6/2004 | Lee et al. | |
| 2006/0001166 A1 | 1/2006 | Igarashi et al. | |
| 2007/0030628 A1 | 2/2007 | Yamamoto et al. | |
| 2007/0081312 A1 | 4/2007 | Noda et al. | |
| 2007/0170582 A1 | 7/2007 | Nomura et al. | |
| 2008/0149381 A1 | 6/2008 | Kawagishi et al. | |

FOREIGN PATENT DOCUMENTS

| | | |
|---|---|---|
| EP | 1 225 629 A2 | 7/2002 |
| JP | 05-136558 A | 6/1993 |
| JP | 08-191128 A | 7/1996 |
| JP | 11-40918 A | 2/1999 |
| JP | 2001-177043 A | 6/2001 |
| JP | 2002-110717 A | 4/2002 |
| JP | 2002-290051 A | 10/2002 |

(Continued)

OTHER PUBLICATIONS

Official Communication issued in corresponding European Patent Application No. 08740252.5, mailed on Dec. 6, 2010.

(Continued)

*Primary Examiner* — Tuan T Dinh
(74) *Attorney, Agent, or Firm* — Keating & Bennett, LLP

(57) ABSTRACT

A component-embedded module includes a module substrate having wiring electrodes on the upper surface thereof, first circuit components mounted on the wiring electrodes, a sub-module disposed on an area on which no wiring electrodes are provided, and an insulating resin layer provided on substantially the entire upper surface of the module substrate such that the insulating resin layer covers at least a portion of the first circuit components and sub-module. The second circuit components including an integrated circuit element are mounted on the sub-module or embedded therein. Via conductors are provided through the module substrate from the lower surface thereof and are directly coupled to terminal electrodes on the lower surface of the sub-module. By using a substrate having a wiring greater accuracy than that of the module substrate, a reliable component-embedded module is obtained.

17 Claims, 6 Drawing Sheets

FOREIGN PATENT DOCUMENTS

| | | | |
|---|---|---|---|
| JP | 2002-344146 | A | 11/2002 |
| JP | 2003-188538 | A | 7/2003 |
| JP | 2005-251904 | A | 9/2005 |
| JP | 2006-019361 | A | 1/2006 |
| JP | 2006-32402 | A | 2/2006 |
| JP | 2006-173167 | A | 6/2006 |
| JP | 2007-67369 | A | 3/2007 |
| WO | 2007/034629 | A1 | 3/2007 |
| WO | 2007/072616 | A | 6/2007 |

OTHER PUBLICATIONS

Official Communication issued in International Patent Application No. PCT/JP2008/057155, mailed on May 27, 2008.

Official Communication issued in corresponding Chinese Patent Application No. 200880012186.5, mailed on Sep. 13, 2010.

Official Communication issued in corresponding Japanese Patent Application No. 2009-512911, drafted on Sep. 3, 2009.

\* cited by examiner

BEFORE MOUNTING
COMPONENTS

MOUNT
COMPONENTS

FILL WITH RESIN

FORM VIA
THROUGH
BUILT-IN
LAYER

PEEL OFF
SUPPORT PLATE

BOND THIN
LAYER /BUILD UP

FORM VIA
HOLES
THROUGH THIN
LAYER

FORM VIA
CONDUCTORS
AND PATTERN
WIRING

BEFORE MOUNTING COMPONENTS

MOUNT COMPONENTS

FILL WITH RESIN

FORM VIA THROUGH BUILT-IN LAYER

ELIMINATE REINFORCING PLATE

FORM VIA HOLES THROUGH THIN LAYER

FORM VIA CONDUCTORS AND PATTERN WIRING

COMPONENT-EMBEDDED MODULE AND MANUFACTURING METHOD THEREOF

BACKGROUND OF THE INVENTION

1. Field of the Invention

The present invention relates to a component-embedded module having multiple circuit components embedded therein, and a manufacturing method thereof.

2. Description of the Related Art

A component-embedded module using a component-embedded substrate having circuit components embedded in an insulating resin layer has been used in wireless apparatuses, such as cell phones, car phones, and other various communication apparatuses. Japanese Unexamined Patent Application Publication No. 2003-188538 discloses a module in which multiple circuit components are mounted on a module substrate made of a ceramic multilayer substrate and an insulating resin layer is formed on the entire upper surface of the module substrate such that the insulating resin layer covers the circuit components.

The circuit components mounted on the module substrate include not only an integrated circuit element, such as a semiconductor integrated circuit, but also peripheral passive components, such as a filter and a capacitor. Since a passive component, such as a filter, has few terminals, the dimensional accuracy of lands or wiring lines of the substrate on which the passive component is to be mounted does not need to be very high. On the other hand, an integrated circuit element has a large number of input/output terminals and these terminals are disposed at a narrow pitch. Therefore, in order to connect the integrated circuit element to external circuits, it is necessary to accurately form many lands or wiring lines on the substrate on which the integrated circuit element is to be mounted.

For a component-embedded module having an integrated circuit element and passive components mounted in parallel on one module substrate, the dimensional accuracy of lands or wiring lines provided on the module substrate must be very high corresponding to the integrated circuit element. For this reason, there has been a problem in that a module substrate having lands or wiring lines provided thereon with high accuracy must be prepared and this causes an increase in cost.

Also, when mounting an integrated circuit element having multiple pins and a narrow pitch, such as a BGA (ball grid array) or a WLP (wafer level package), on a module substrate, flip-chip-mounting is often used. In this case, there is a problem in that it is difficult to check whether the mounting state (connection state) is normal, there is a high possibility that a coupling failure is found by performing an inspection after the module is completed, and these problems and conditions cause a reduction in yield.

SUMMARY OF THE INVENTION

To overcome the problems described above, preferred embodiments of the present invention provide a reliable component-embedded module that enables a reduction in cost and an increase in yield, and a manufacturing method thereof.

A component-embedded module according to a preferred embodiment of the present invention includes a module substrate having a wiring pattern on each of an upper surface and a lower surface thereof and having a via conductor or a through hole conductor extending therethrough, the via conductor or through hole extending from the wiring pattern on the lower surface to the upper surface, a first circuit component mounted on the wiring pattern on the upper surface of the module substrate, a sub-module arranged such that an area thereof is less than an area of the module substrate, the sub-module having a terminal electrode on a lower surface thereof, the sub-module being disposed on an area of the upper surface of the module substrate, the area being an area on which the wiring pattern is not provided, a second circuit component mounted on the sub-module and/or embedded in the sub-module, and an insulating resin layer provided on substantially the entire upper surface of the module substrate such that the insulating resin layer covers at least a portion of the first circuit component and the sub-module. The terminal electrode of the sub-module is directly coupled to the via conductor or the through hole conductor extending through the module substrate.

A component-embedded module manufacturing method according to a preferred embodiment of the present invention includes a first step of forming a wiring pattern on a support plate, a second step of mounting a first circuit component on the wiring pattern, a third step of disposing a sub-module on an area on the support plate, the area being an area on which the wiring pattern is not formed, the sub-module having a terminal electrode on a lower surface thereof, the sub-module having a second circuit component embedded therein or mounted thereon, a fourth step of forming an insulating resin layer on the support plate such that the insulating resin layer covers at least a portion of the first circuit component and the sub-module, a fifth step of peeling off the support plate from the wiring pattern, the sub-module, and the insulating resin layer, a sixth step of laminating a module substrate on the wiring pattern, the sub-module, and the insulating resin layer, and a seventh step of forming a via conductor or a through hole conductor through the module substrate such that the via conductor or the through hole conductor makes contact with the terminal electrode of the sub-module.

A component-embedded module manufacturing method according to another preferred embodiment of the present invention includes a first step of preparing a semi-cured module substrate having a wiring pattern formed on an upper surface thereof, a second step of mounting a first circuit component on the wiring pattern, a third step of disposing a sub-module on an area on the module substrate, the area being an area on which the wiring pattern is not formed, the sub-module being formed such that an area thereof is less than an area of the module substrate, the sub-module having a terminal electrode on a lower surface thereof, the sub-module having a second circuit component embedded therein and/or mounted thereon, a fourth step of forming an insulating resin layer on the module substrate such that the insulating resin layer covers at least a portion of the first circuit component and the sub-module, and a fifth step of forming one of a via conductor and a through hole conductor, the via conductor and the through hole extending from the lower surface of the module substrate to the terminal electrode on the lower surface of the sub-module.

Hereafter, the component-embedded module according to a preferred embodiment of the present invention will be described. The first circuit component is mounted on the wiring pattern on the upper surface of the module substrate, and the sub-module is disposed on the area of the upper surface of the module substrate on which no wiring pattern is provided. The wiring pattern includes lands for mounting circuit components and wiring lines for coupling the lands to each other or coupling the lands to other electrodes. When the sub-module is disposed, the module substrate and sub-module do not need to be electrically coupled to each other. The area of the sub-module is less than that of the module substrate, and the sub-module has the terminal electrode on the lower surface thereof. The second circuit component is mounted on the sub-module or embedded therein. Alternatively, the multiple second circuit components may be mounted on the sub-module and embedded therein. By forming the insulating resin layer on substantially the entire upper surface of the module substrate such that the insulating resin layer covers at least a portion of the first circuit component and sub-module, the component-embedded module is provided. The via conductor or through hole conductor extending from the wiring pattern on the lower surface of the module substrate to the upper surface thereof is provided through the module substrate. The upper end of the via conductor or through hole conductor is in contact with the terminal electrode of the sub-module. That is, the wiring pattern on the module substrate and the terminal electrode of the sub-module are directly coupled to each other through the via conductor or through hole conductor.

For example, if the first circuit component is an individual component having few terminals, such as a filter or a capacitor and the second circuit component is an integrated circuit element having many terminals, it is possible to use a substrate (e.g., a multilayer substrate, etc.) having a high wiring accuracy as the sub-module having the second circuit component mounted thereon and/or embedded therein and use a substrate having a relatively low wiring accuracy, that is, a low-unit-cost substrate as the module substrate having the first circuit component mounted thereon. In this case, the unit cost per unit area of the sub-module is greater than that of the module substrate. However, the cost can be reduced as compared to a case in which the entire module substrate is made of a substrate having a high wiring accuracy, since the sub-module is smaller in size than the module substrate.

Although the terminal electrode is preferably provided on the lower surface of the sub-module, it is possible to make the number of the terminal electrodes less than the number of the terminals of the integrated circuit element mounted on the sub-module or embedded therein or make the intervals between the terminal electrodes wider than the intervals between the terminals of the integrated circuit element by correctly coupling wiring lines inside the sub-module. For this reason, the sub-module having a high wiring accuracy can be disposed on the module substrate having a relatively low wiring accuracy.

If the second circuit component mounted on the sub-module is a flip-chip-mounted integrated circuit element, it is difficult to check the mounting state (coupling state) of the integrated circuit element, since the integrated circuit element has many terminals. Also, a defective item may be found by performing an inspection after the module is completed. This results in a reduction in yield. On the other hand, in preferred embodiments of the present invention, the second circuit component is mounted on the sub-module substrate. Therefore, it is possible to inspect the coupling state of the second circuit component in the stage of the sub-module. If a coupling failure is discovered, it is also possible to make correct and thus prevent a reduction in yield.

If the first circuit component includes a circuit component having a height greater than that of the second circuit component, preferred embodiments of the present invention are effective. In recent years, as a package of a semiconductor integrated circuit used in a portable apparatus or other device, a flip-chip structure formed by performing bumping on a silicon wafer, a wafer level package formed by performing re-wiring and then attaching solder bumps, have been used instead of a conventional mold package. That is, downsizing and slimming down of the module are progressing. In many cases, the heights of peripheral passive components, such as a filter and a capacitor are greater than that of an integrated circuit element. For this reason, the second circuit component having a reduced height is mounted on the sub-module and/or embedded therein and the first circuit component having an increased height is mounted on the module substrate. Thus, it is possible to average the height of the first circuit component and that of the sub-module and thus further slim down the module. Also, since the wiring pattern on the lower surface of the module substrate and the terminal electrode of the sub-module are directly coupled to each other through the via conductor or through hole conductor, there is no need to form a sub-module mounting pad on the upper surface of the module substrate. Further, a bonding material for mounting a sub-module is not required, so the height of the entire module can be reduced. Also, since solder is not used to mount the sub-module, there is no concern about the occurrence of a solder flash in a reflow step.

As a method for forming an insulating resin layer, for example, an insulating resin layer placed in a B-stage (semi-cured) state may be crimped onto the module substrate and then cured, or a liquid insulating resin may be molded on the module substrate and then cured. Any other suitable methods for forming an insulating resin layer may be used. By forming the insulating resin layer, the module substrate and sub-module are reliably fixed to each other and the module substrate and first circuit component are reliably fixed to each other.

The lower surface of the sub-module may be bonded to the upper surface of the module substrate using the bonding sheet, and the via conductor or through hole conductor may be passed through the bonding sheet. When forming the insulating resin layer, it is preferable to fix the sub-module onto the module substrate so as to prevent misalignment of the sub-module. If the bonding sheet is used, the sub-module can be uniformly surface-bonded to the module substrate. As the bonding sheet, for example, a thermosetting resin sheet, for example, is preferably used.

If the bonding sheet is made of a material identical to the material of the insulating resin layer, all of the materials surrounding the sub-module can be made identical or substantially identical to one another. Thus, the thermal expansion coefficients are made identical or substantially identical to one another so that the structure and characteristics are stabilized.

Also, the perimeter of the sub-module is preferably positioned using the resist pattern provided on the upper surface of the module substrate. That is, since the resist pattern is formed in accordance with the external shape of the sub-module, the position of the sub-module is preferably fixed by the resist pattern. If a high temperature is applied to the bonding sheet when bonding the sub-module onto the module substrate using the bonding sheet, the sub-module may be misaligned. On the other hand, the resist pattern is deformed to a much lesser extent by a high temperature. Therefore, the perimeter of the sub-module can be stably held and misalignment can be prevented. While the resist pattern may be displaced when stress is applied thereto, the sub-module can be fixed accurately and stably by using both the bonding sheet and resist pattern.

As a method for fixing the sub-module to the module substrate, not only the method of using the bonding sheet but also Sn precoating mounting can be used. Specifically, the Sn precoating mounting is a method of forming fixing lands precoated with Sn on the upper surface of the module substrate on which no wiring patterns are formed, forming dummy electrodes on the lower surface of the sub-module independently of the terminal electrode, and mounting the dummy electrodes on the fixing lands by precoating. The fixing lands are not electrically coupled to the via conductor or through hole conductor provided on the module substrate. The dummy electrodes are also independent electrodes that are not electrically coupled to the terminal electrode. By using this method, when mounting the first circuit component on the wiring pattern on the module substrate by Sn precoating, the sub-module can also be simultaneously mounted by precoating. This improves the efficiency of the manufacturing method.

A shield layer may preferably be provided on an upper surface of the insulating resin layer. A ground electrode may preferably be provided on one of an upper surface of the sub-module and the upper surface of the module substrate. A via conductor coupling the shield layer and the ground electrode may preferably be provided through the insulating resin layer. In this case, the shield layer covers substantially the entire upper surface of the module substrate. Therefore, it provides a shield against external electromagnetic noise and prevents electromagnetic noise, which internally occurs, from leaking out. Thus, a component-embedded module having a good shield effect is produced.

A method for manufacturing a component-embedded module according to a preferred embodiment of the present invention includes forming a wiring pattern on a support plate, mounting a first circuit component on the wiring pattern and disposing a sub-module on an area on the support plate on which no wiring pattern is formed, and forming an insulating resin layer on the support plate such that the insulating resin layer covers at least a portion of the first circuit component and the sub-module. In addition, after the insulating resin layer is cured, the method may preferably include peeling off the support plate from the wiring pattern, sub-module, and insulating resin layer, laminating a module substrate on the lower surface from which the support plate has been peeled off, and forming a via conductor or a through hole conductor through the module substrate such that the via conductor or through hole conductor makes contact with the terminal electrode of the sub-module. In this case, the insulating resin layer is preferably formed around the sub-module and subsequently the module substrate is laminated and then the via conductor or through hole conductor is formed, so that the via conductor or through hole conductor can be reliably coupled to the terminal electrode on the lower surface of the sub-module. Therefore, problems, such as peeling off of the lands or bonding material due to curing and contraction of the insulating resin layer, do not occur.

When laminating the module substrate on the wiring pattern, sub-module, and insulating resin layer after peeling off the support plate, the module substrate is preferably bonded in a semi-cured state. In this case, it is possible to laminate the module substrate easily using the adhesiveness of the module substrate without using an adhesive or other bonding agent.

When disposing the sub-module on the support plate, simply placing the sub-module on the support plate does not stabilize the position of the sub-module. For this reason, the sub-module is preferably bonded onto the support plate using the bonding sheet. Thus, misalignment of the sub-module in the stage before forming the insulating resin layer can be prevented. If the bonding sheet is also extended to the side surfaces of the sub-module when crimping the sub-module onto the bonding sheet, the sub-module can be more firmly fixed. By bonding substantially the entire lower surface of the sub-module to the support plate using the bonding sheet, gaps can be filled.

Another method for manufacturing a component-embedded module according to a preferred embodiment of the present invention includes preparing a semi-cured module substrate having a wiring pattern formed on an upper surface thereof, mounting a first circuit component on the wiring pattern, disposing a sub-module on an area on the module substrate on which no wiring pattern is formed, and forming an insulating resin layer on the module substrate such that the insulating resin layer covers at least a portion of the first circuit component and the sub-module. In addition, after the insulating resin layer is formed, a via conductor or a through hole conductor extending from the lower surface of the module substrate to the terminal electrode on the lower surface of the sub-module may preferably be formed. In this case, the semi-cured module substrate is used, such that the number of steps can be reduced.

In the above-mentioned manufacturing methods, the thinnest possible module substrate is preferably used to reduce the thickness of the module. However, such a module substrate can be easily deformed and it is difficult to ensure the accuracy. In this case, by performing the step of mounting the first circuit component, the step of disposing the sub-module, and the step of forming the insulating resin layer in a state in which the module substrate is fixed to the reinforcing plate, deformation can be prevented.

As described above, in the component-embedded module according to a preferred embodiment of the present invention, the first circuit component and sub-module are mounted on the module substrate, and the second circuit component is mounted on the sub-module and/or embedded therein. Thus, the first circuit component and second circuit component can be disposed on optimum substrates corresponding to the wiring accuracies thereof. In particular, if an integrated circuit element is used as the second circuit component, a reliable module can be provided by using a substrate having a high wiring accuracy as a sub-module. In addition, the cost can be reduced as compared to a case in which the entire module substrate is module of a substrate having a high wiring accuracy. Further, since the second circuit component can be inspected in the stage when it is mounted on the sub-module, the yield can be increased as compared to a case where an inspection is performed after the module is completed.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereafter, preferred embodiments of the present invention will be described with reference to working examples.

First Working Example

Figure 1:
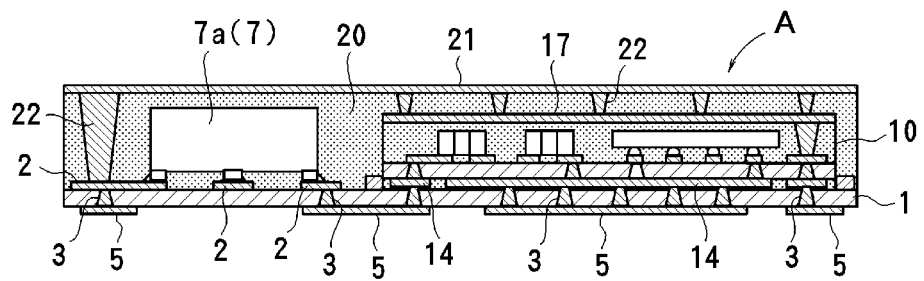
FIG. 1 is a sectional view of a working example of a preferred embodiment of a component-embedded module according to the present invention.
Figure 2:
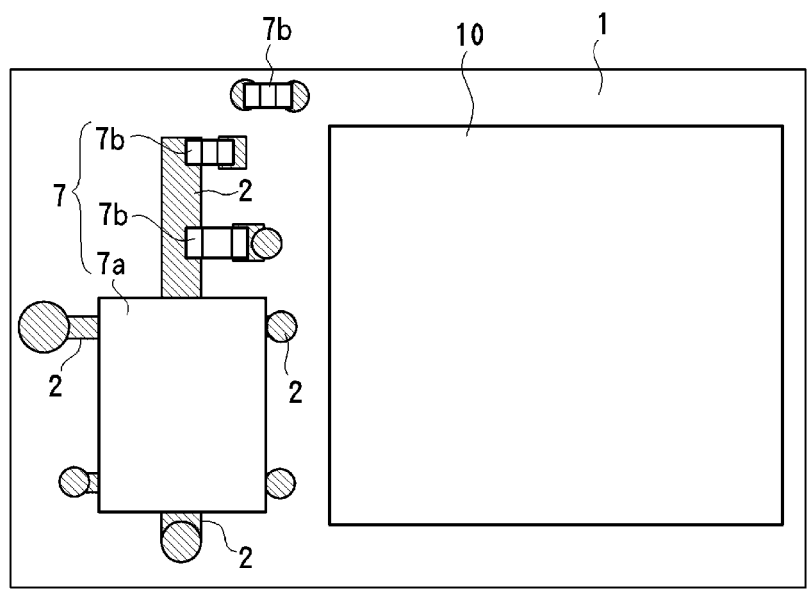
FIG. 2 is a plan view of the component-embedded module of FIG. 1 excluding an insulating resin layer.
Figure 3:
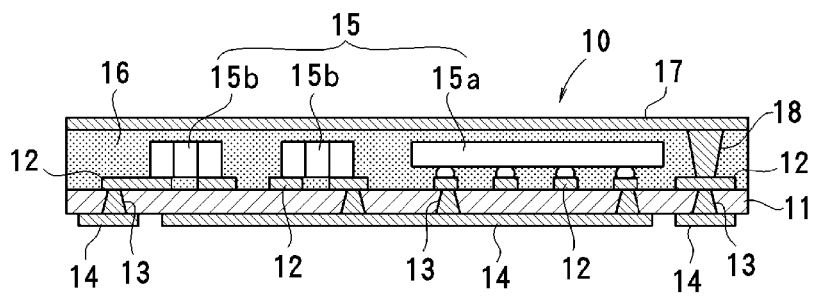
FIG. 3 is an enlarged sectional view of a sub-module of the component-embedded module shown in FIG. 1.

FIGS. 1 to 3 show a first working example of a component-embedded module according to the present invention. FIG. 1 is an overall sectional view of the component-embedded module. FIG. 2 is a plan view of the component-embedded module excluding an insulating resin layer. FIG. 3 is an enlarged sectional view of a sub-module.

The component-embedded module A includes a module substrate 1 preferably defined by an insulating substrate, such as a resin substrate, for example. Here, a substrate having a single-layer structure is shown as the module substrate 1. However, a multilayer substrate may also be used. As shown in FIG. 1, multiple wiring electrodes 2 are provided on areas of the upper surface of the module substrate 1, and are coupled to wiring electrodes 5 on the lower surface thereof through via conductors 3. Some of the wiring electrodes 5 define terminal electrodes of the component-embedded module A. The via conductors 3 are also provided on an area on which a sub-module 10 (to be described later) is to be mounted, that is, on an area on which no wiring electrodes 2 are provided. First circuit components 7 having a few terminals, such as a filter and a capacitor, are mounted on the wiring electrodes 2 on the upper surface of the module substrate 1. The first circuit components 7 include a component 7a having a height greater than that of a second circuit component 15 to be described later and components 7b having heights less than those of the second circuit components 15.

The sub-module 10 shown in FIG. 3 is bonded and fixed to the area of the module substrate 1 on which no wiring electrodes 2 are provided. The sub-module 10 includes a sub-module substrate 11 that is preferably defined by a resin substrate, for example, and whose area is less than that of the module substrate 1, second circuit components 15 mounted on the upper surface of the sub-module substrate 11, and a resin layer 16 provided on the sub-module substrate 11 such that the resin layer 16 covers the second circuit components 15. That is, the sub-module 10 according to this working example is preferably defined by a component-embedded substrate. The resin layer 16 is preferably made of a resin composition made of a thermosetting resin or a compound of a thermosetting resin and an inorganic filler, for example. Multiple wiring electrodes 12 are patterned on the upper surface of the sub-module substrate 11. Multiple terminal electrodes 14 are independently provided on the lower surface thereof. The wiring electrodes 12 are coupled to the terminal electrodes 14 through via conductors 13. The second circuit components 15 include an integrated circuit element 15a, individual passive components 15b, and other suitable components. The integrated circuit element 15a is preferably flip-chip-mounted on the wiring electrodes 12. The individual passive components 15b are preferably mounted on other wiring electrodes 12 using precoating, soldering, a conductive adhesive, or other suitable bonding method, for example. Here, the individual passive components 15b as well as the integrated circuit element 15a are mounted as the second circuit components 15. However, only the integrated circuit element 15a may be mounted. By correctly connecting wiring lines inside the sub-module substrate 11, it is possible to make the number of the terminal electrodes 14 on the lower surface less than the number of land portions of the wiring electrodes 12 on the upper surface or expand the intervals between the electrodes. A shield electrode 17 is preferably provided on the upper surface of the resin layer 16. The shield electrode 17 is coupled to the grounding wiring electrode 12 through a via conductor 18 and is further coupled to the grounding terminal electrodes 14 through via conductors 13.

An insulating resin layer 20 is provided on substantially the entire upper surface of the module substrate 1. The first circuit components 7 and sub-module 10 are embedded in the insulating resin layer 20. The insulating resin layer 20 is preferably, for example, a resin composition including a thermosetting resin or a compound of a thermosetting resin and an inorganic filler. The insulating resin layer 20 has a function of increasing the strength with which the module substrate 1 and sub-module 10 are fixed to each other and the strength with which the module substrate 1 and first circuit components 7 are fixed to each other. A shield layer 21 made of a copper foil or other suitable material, for example, is preferably provided on the upper surface of the resin layer 20. The shield layer 21 is coupled to the grounding wiring electrode 2 on the module substrate 1 and the shield electrode 17 on the upper surface of the sub-module 10 through via conductors 22.

As described above, the lower surface of the sub-module 10 is preferably bonded and fixed to the area of the module substrate 1 on which no wiring electrodes 2 are provided. The via conductors 3 provided on the module substrate 1 are preferably directly coupled to the terminal electrodes 14 provided on the lower surface of the sub-module 10. That is, no wiring electrodes for mounting are provided on the upper surface of the module substrate 1 opposed to the sub-module 10, nor is a bonding material for mounting the sub-module 10 provided thereon. This makes it possible to fix the sub-module 10 onto the module substrate 1 such that the sub-module 10 is brought into close contact with the module substrate 1. This makes it possible to reduce the thickness of the component-embedded module A.

As the material of which the sub-module substrate 11 of the sub-module 10 is made and the material of which the resin layer 16 thereof is made, an identical material or materials having thermal expansion coefficients close to each other may preferably be used, for example. In addition, as the material of which the module substrate 1 is made and the material of which the insulating resin layer 20 is made, an identical material or materials having thermal expansion coefficients close to each other may preferably be used, for example. Further, as the material of which the sub-module substrate 11 and resin layer 16 are made, a material having a thermal expansion coefficient close to that of the integrated circuit element 15a may preferably be used, for example. As the module substrate 1, a material having a thermal expansion coefficient that is in between that of the sub-module 10 and that of a motherboard, on which the component-embedded module A is to be mounted, may preferably be used, for example. In this case, the difference between the thermal expansion coefficient of the integrated circuit element 15a and that of the motherboard can be reduced using the module substrate 1 and sub-module 10. Thus, a problem such as peeling off of an electrode (terminal) due to variations in temperature can be eliminated. As with the module substrate 1, as the insulating resin layer 20, a material having a middle thermal expansion coefficient may preferably be used, for example.

Since the first circuit components 7 include the component 7a having a height greater than those of the second circuit components 15, the heights of the first circuit components 7 and that of the sub-module 10 are averaged. Thus, the overall height of the component-embedded module A can be reduced. While an example in which the thicknesses of the first circuit components 7 are slightly greater than that of the sub-module 10 is shown in FIG. 1, the thickness of the sub-module 10 may be greater than those of the first circuit components 7 or the thicknesses of the first circuit components 7 and that of the sub-module 10 may be equal to each other. Also, the shield layer 21 on the upper surface of the insulating resin layer 20 and the via conductors 22 may be omitted.

As described above, if the integrated circuit element 15a is embedded in the sub-module 10 and the individual passive components 7 are mounted on the module substrate 1, the sub-module 10 is required to have a wiring accuracy greater than that of the module substrate 1. That is, the sub-module 10 must be a substrate manufactured under a more stringent design than that for the module substrate 1. For this reason, the unit cost per unit area of the sub-module 10 is greater than that of the module substrate 1. However, the cost can be made less than that when the entire module substrate 1 is made of a substrate having a high wiring accuracy, since the sub-module 10 is less than the module substrate 1.

Since the integrated circuit element 15a is flip-chip-mounted on the sub-module substrate 11, it is difficult to check the mounting state (coupling state) visually. For this reason, it is necessary to electrically inspect the mounting state. While it is possible to perform an inspection after the component-embedded module A is completed, the entire module A must be discarded if a failure is discovered. On the other hand, in this working example, the integrated circuit element 15a is mounted on the sub-module substrate 11. Therefore, it is possible to inspect the coupling state of the integrated circuit element 15a in the stage of the sub-module 10, before forming the resin layer 16. Specifically, it is sufficient to measure electrical characteristics using the terminal electrodes 14 of the sub-module 10. If a failure is found in this stage, it is possible to demount the integrated circuit element 15a from the sub-module substrate 11 and remount an integrated circuit element 15a. This significantly increases the yield.

Hereafter, an example of a method for manufacturing the component-embedded module A having the above-mentioned configuration will be described with reference to FIGS. 4A-4H. While a method for manufacturing the component-embedded module A placed in a child-substrate-state will be described hereafter, in practice, the component-embedded modules A are manufactured in a combined-substrate-state where multiple child substrates are combined and then the combined substrate is divided into child substrates.

Figure 4A:
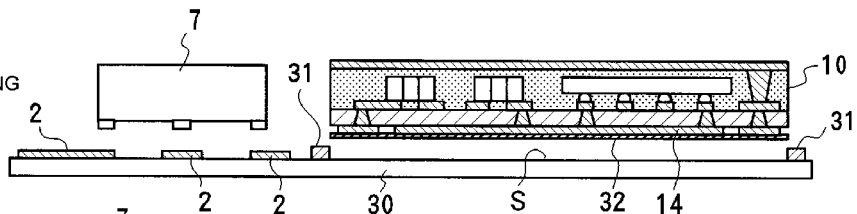
FIGS. 4A to 4H include drawings showing a process of manufacturing the component-embedded module shown in FIG. 1.
Figure 5:
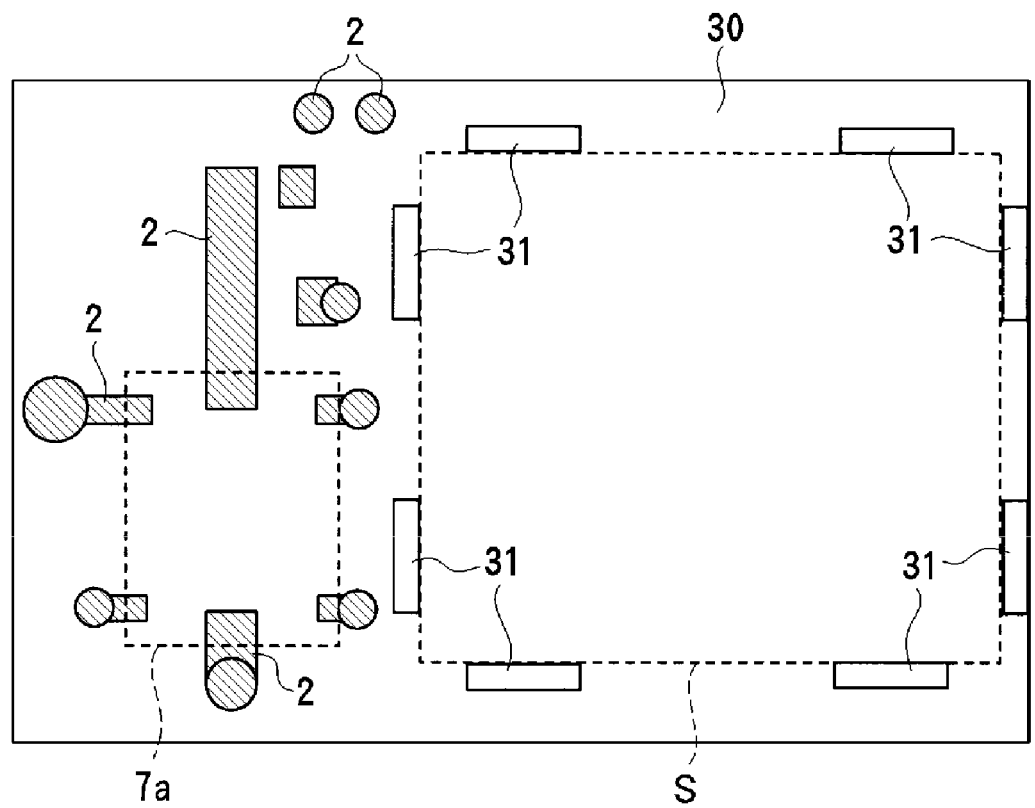
FIG. 5 is a plan view of a support plate used in the manufacturing process shown in FIGS. 4A-4H.

As shown in FIG. 4A, the sub-module 10 and first circuit components 7 and a support plate 30 are prepared. As shown in FIG. 5, the wiring electrodes 2 are preferably formed on some areas of the upper surface of the support plate 30, for example, by patterning a metal foil. Also, multiple resist patterns 31 are formed such that the resist patterns surround an area S on which no wiring electrodes 2 are formed. The sub-module 10 is mounted on the area S. A bonding sheet 32 is bonded to the lower surface of the sub-module 10, that is, the surface on which the terminal electrodes 14 are formed. The bonding sheet 32 is preferably, for example, a thin, thermosetting resin sheet having a thickness of about 50 μm. As the bonding sheet 32, it is preferable to use a material identical or substantially identical to that of the resin layer 16 of the sub-module 10 or that of the insulating resin layer 20 of the module substrate 1. This makes it possible to make all the materials covering the sub-module identical to one another. This is intended to prevent unevenness in thermal expansion coefficient and to stabilize the structure and characteristics. The bonding sheet 32 is not required to be a previously shaped sheet and may be, for example, a yet-to-be-cured bonding layer that is applied to the upper surface of the support plate 30 or the lower surface of the sub-module 10 by printing or other suitable method.

Figure 4B:
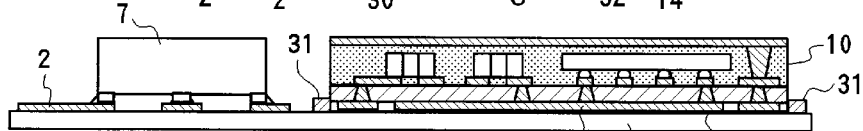

FIG. 4B shows a state in which the sub-module 10 is bonded to the area S of the support plate 30 using the bonding sheet 32 and the first circuit components 7 are mounted on the wiring electrodes 2 near the sub-module 10. When bonding the sub-module 10, the perimeter of the sub-module 10 is positioned using the resist patterns 31. The resist patterns 31 are formed in accordance with the external shape of the sub-module 10. A method for mounting the first circuit components 7 may or the like be precoating mounting, reflow soldering, flip-chip mounting using bumps, or mounting using a conductive adhesive, for example.

When bonding the sub-module 10 to the support plate 30, it is preferable to crimp the sub-module 10 onto the support plate 30 in a state in which the support plate 30 is heated so that the bonding sheet 32 is softened and fluidized. Thus, the thickness of the bonding sheet 32 is preferably reduced to, e.g., about 20 μm to about 30 μm. This also allows the bonding sheet 32 to extend to the sides of the sub-module 10. Thus, the strength with which the sub-module 10 is fixed is increased. Also, the terminal electrodes 14 are formed on the lower surface of the sub-module 10 and thus small bumps and dips occur. However, since the bonding sheet 32 softens due to heat crimping, it is possible to reliably bridge gaps created between the sub-module 10 and support plate 30 by the bumps and dips. While the sub-module 10 may be misaligned due to the softening, such misalignment is prevented by positioning the perimeter of the sub-module 10 using the heat-resistant resist patterns 31. After the bonding, the bonding sheet 32 is cured.

Figure 4C:
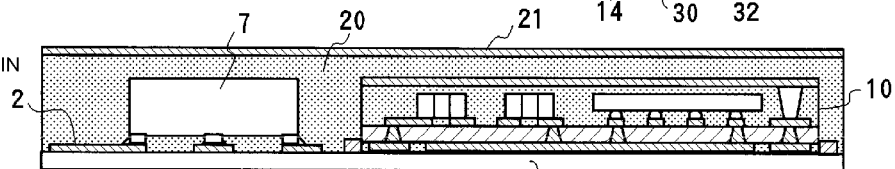

FIG. 4C shows a state in which the insulating resin layer 20 is formed on substantially the entire upper surface of the support plate 30 such that the insulating resin layer 20 covers the sub-module 10 and first circuit components 7 and the shield layer 21 is formed on the upper surface of the insulating resin layer 20. A method for forming the insulating resin layer 20 and shield layer 21 may preferably be, for example, a method of disposing a copper foil, which is to become the shield layer 21, on the upper surface of the insulating resin layer 20 placed in a B-stage (semi-cured) state, crimping the insulating resin layer 20 onto the support plate 30, and then curing the insulating resin layer 20, or a method of molding an insulating resin on the support plate 30, curing the insulating resin, and then forming the shield layer 21 on the upper surface of the insulating resin layer 20 by electroless plating, for example. Any other methods may be used to form the insulating resin layer 20 and shield layer 21. While an example in which the insulating resin layer 20 covers substantially the entire sub-module 10 and first circuit components 7 is shown here, a portion of the sub-module 10 or a portion of the first circuit components 7 may be exposed from the insulating resin layer 20.

Figure 4D:
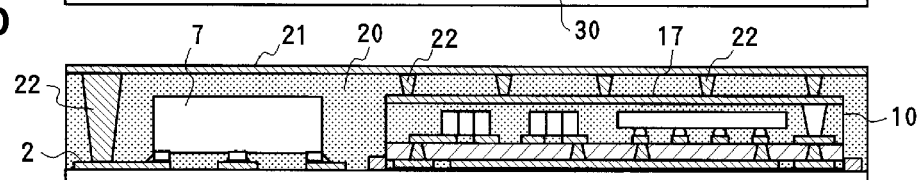

FIG. 4D shows a state in which, after the insulating resin layer 20 is cured, a via hole extending to the ground electrode 2 on the upper surface of the support plate 30 and via holes extending to the shield electrode 17 on the upper surface of the sub-module 10 are formed through the insulating resin layer 20 and are then filled with conductors, such as conductive pastes, for example, then the conductors are cured, and thus via conductors 22 are formed and coupled to the shield layer 21. The via holes can be formed using a known method, such as a method of making openings on areas, on which via holes need to be formed, of the copper foil on the upper surface of the insulating resin layer 20 and applying lasers so that the lasers pass through the openings, for example. Also, after the via holes are filled with conductors, such as conductive pastes, and the conductors are cured, it is preferable to perform lid plating so that the exposed portions of the conductors are covered. The via conductors 22 are not limited to via conductors formed by filling the via holes with conductors and may be through hole conductors formed by forming electrode films on the inner surfaces of the via holes by electroless plating, for example.

Figure 4E:

FIG. 4E shows a state in which after the insulating resin layer 20 is cured, the support plate 30 is peeled off. The wiring electrodes 2, the insulating resin layer 20, and the lower surface (cured bonding sheet 32) of sub-module 10 are exposed on the lower surface from which the support plate 30 has been peeled off.

Figure 4F:
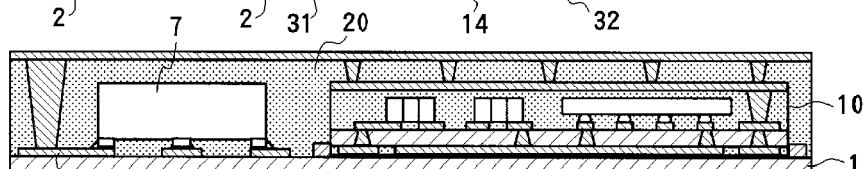

FIG. 4F shows a state in which the thin module substrate 1 is bonded to the lower surface from which the support plate 30 has been peeled off. Since the module substrate 1 is in a semi-cured state (B stage) at the time of bonding, the module substrate 1, and the wiring electrodes 2, insulating resin layer 20, and sub-module 10 are preferably brought into close contact with each other by crimping the module substrate 1. In this state, the module substrate 1 is cured.

Figure 4G:
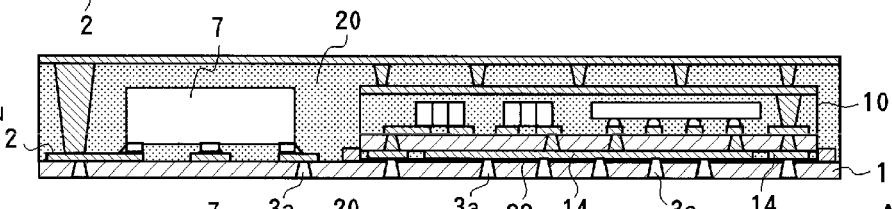

FIG. 4G shows a state in which via holes 3a are formed through the cured module substrate 1 from the lower surface thereof using lasers. At that time, the via holes 3a are formed to a depth extending to the wiring electrodes 2, and are formed to a depth extending to the terminal electrodes 14 through the bonding sheet 32 bonded to the lower surface of the sub-module 10.

Figure 4H:
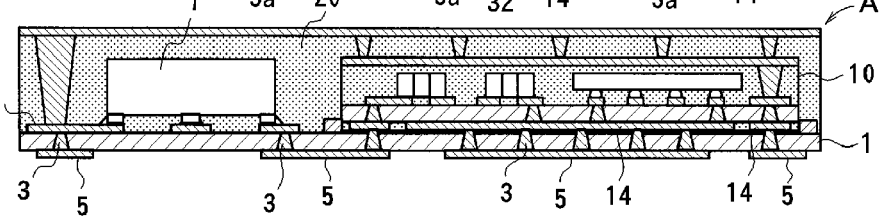

FIG. 4H shows a state in which via conductors 3 or through hole conductors are formed by embedding conductors in the via holes 3a or performing a plating process on the inner surfaces of the via holes 3a. After the via conductors 3 are formed, the wiring electrodes 5 are patterned on the lower surface of the module substrate 1 such that the wiring electrodes 5 cover the via conductors 3. Thus, the wiring electrodes 5 and wiring electrodes 2 are coupled to each other, and the wiring electrodes 5 and terminal electrodes 14 are coupled to each other. In the above-described manner, the component-embedded module A is completed.

FIGS. 6A-6G show another method for manufacturing the component-embedded module A. The same elements as those in FIGS. 4A to 4H are assigned the same reference numerals and descriptions there will not be repeated.

Figure 6A:
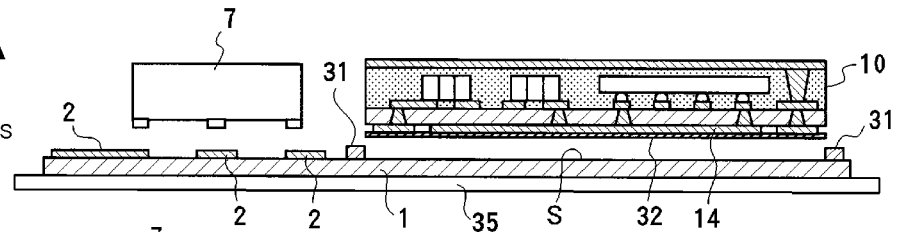
FIGS. 6A to 6G include drawings showing another process of manufacturing the component-embedded module shown in FIG. 1.

In this method, as shown in FIG. 6A, the cured module substrate 1 is initially prepared and the wiring electrodes 2 are formed on the upper surface of the module substrate 1. On the other hand, the resist patterns 31 are formed on the area S on which no wiring electrodes 2 are formed such that the resist patterns 31 surround the area S. If the module substrate 1 is a thin-layer substrate, the strength thereof is relatively low and warpage or distortion easily occurs. For this reason, it is preferable to support the lower surface of the module substrate 1 with a reinforcing plate 35 having high flatness and high strength. In this case, the module substrate 1 may preferably be bonded to the reinforcing plate 35 using a heatproof tape, a sheet whose adhesiveness varies with the temperature, or other suitable bonding agent, for example. Further, the module substrate 1 may be supported by using a plate with air vents as the reinforcing plate 35 and evacuating the air vents.

Figure 6B:
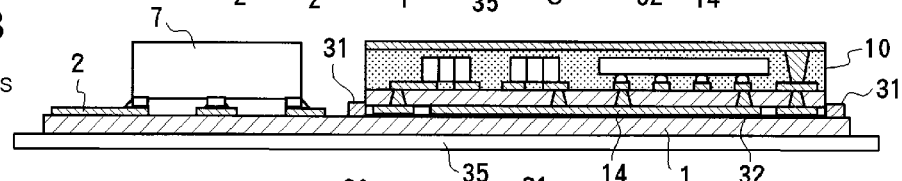

In FIG. 6B, the first circuit components 7 are mounted on the wiring electrodes 2 and the sub-module 10 is bonded and fixed to the area S using the bonding sheet 32. At that time, by positioning the perimeter of the sub-module 10 using the resist patterns 31, misalignment of the sub-module 10 is prevented. By heating and crimping the bonding sheet 32 at the time of bonding, the bonding sheet 32 is softened. This makes it possible to bridge the gaps between the module substrate 1 and sub-module 10 and to fix the sub-module 10.

Figure 6C:
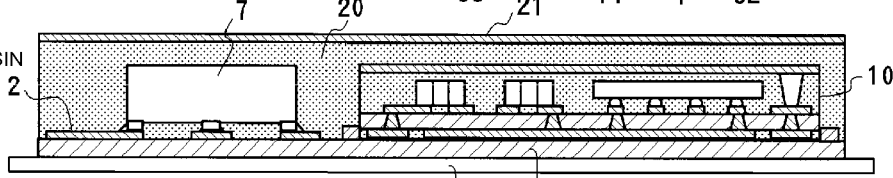

FIG. 6C shows a state in which the insulating resin layer 20 is crimped or molded on the module substrate 1 and the shield layer 21 is formed on the upper surface of the insulating resin layer 20. By forming the insulating resin layer 20, the first circuit components 7 and sub-module 10 are embedded in the insulating resin layer 20.

Figure 6D:
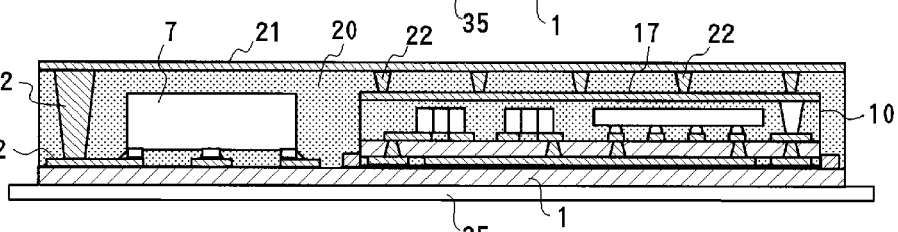

FIG. 6D shows a state in which after the insulating resin layer 20 is cured, a via hole extending to the ground electrode 2 on the upper surface of the module substrate 1 and via holes extending to the shield electrode 17 on the upper surface of the sub-module 10 are formed through the insulating resin layer 20 and then filled with conductors and the conductors are cured, and thus via conductors 22 are formed and coupled to the shield layer 21.

Figure 6E:
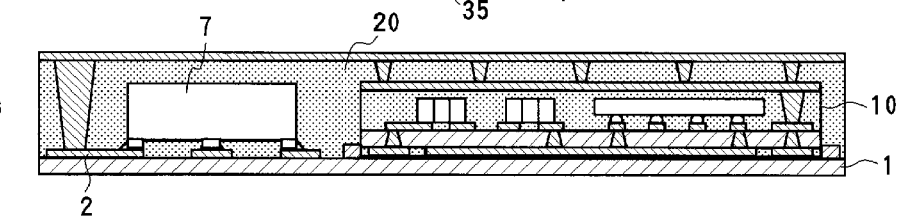

FIG. 6E shows a state in which the reinforcing plate 35 supporting the lower surface of the module substrate 1 is eliminated. If the module substrate 1 and reinforcing plate 35 are bonded together using a heatproof tape, the tape is peeled off. If a sheet, whose adhesiveness varies with the temperature, is used, the reinforcing plate 35 is eliminated by lowering the temperature to a temperature at which the adhesiveness decreases.

Figure 6F:
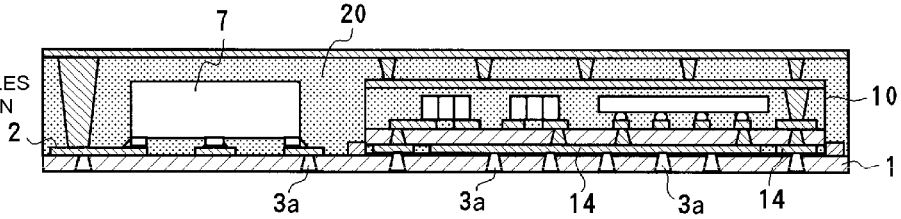

FIG. 6F shows a state in which the via holes 3a are formed through the module substrate 1 from the lower surface thereof using lasers. At that time, the via holes 3a are formed to a depth extending to the wiring electrodes 2 and the terminal electrodes 14 on the lower surface of the sub-module 10.

Figure 6G:
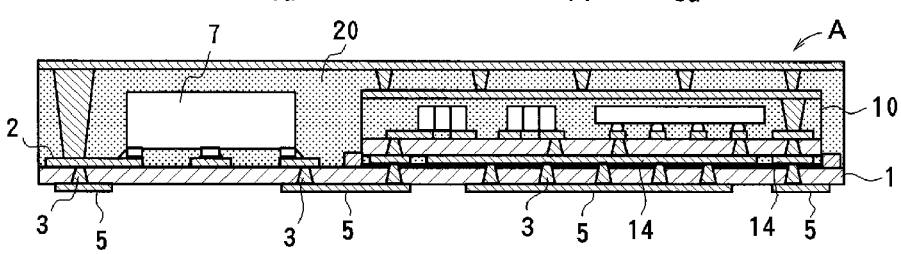

FIG. 6G shows a state in which the via conductors 3 or through hole conductors are formed by embedding conductors in the via holes 3a or performing a plating process on the inner surfaces of the via holes 3a and the wiring electrodes 5 are patterned on the lower surface of the module substrate 1. Thus, the wiring electrodes 5 and wiring electrodes 2 are coupled to each other, and the wiring electrodes 5 and terminal electrodes 14 are coupled to each other. Thus, the component-embedded module A is completed.

In this working example, the cured module substrate 1 is used. Therefore, the number of curing process steps can be reduced by one as compared to that in the manufacturing method shown in FIGS. 4A to 4H. Also, while the support plate 30 is typically thrown away after one use in FIGS. 4A to 4H, the module substrate 1 also functions as a support plate and therefore no base material is required in FIGS. 6A to 6G. In FIG. 6A, the module substrate 1 having no wiring electrodes 5 on the lower surface thereof is preferably used. However, a module substrate 1 having the wiring electrodes 5 patterned on the lower surface thereof in advance may be used. Also, the module substrate 1 is preferably bonded to the reinforcing plate 35 so that deformation of the module substrate 1 is restrained. However, any suitable support method may be used as long as the support method is a method by which the reinforcing plate 35 can be easily eliminated in a later step and the module substrate 1 can withstand the temperature or pressure when forming the insulating resin layer 20.

Second Working Example

Figure 7:
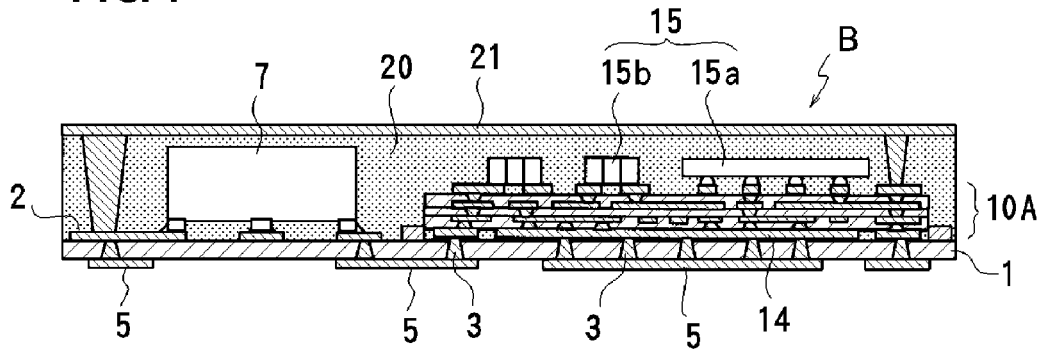
FIG. 7 is a sectional view of a working example of another preferred embodiment of a component-embedded module according to the present invention.
Figure 8:
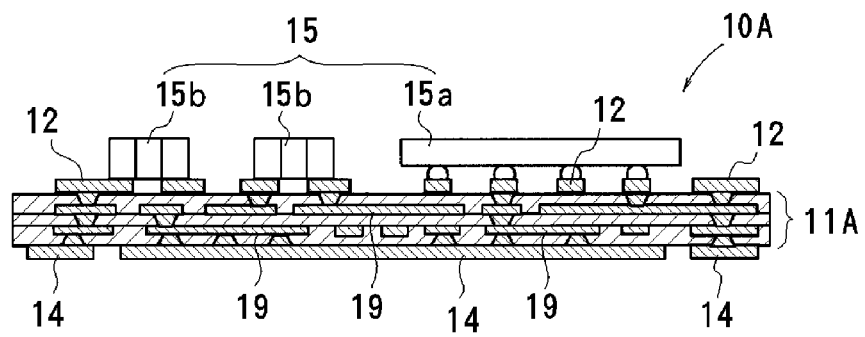
FIG. 8 is an enlarged sectional view of a sub-module of the component-embedded module shown in FIG. 7.

FIGS. 7 and 8 show a second working example of a component-embedded module. Elements corresponding to those in the first working example are assigned the same reference numerals and descriptions thereof will not be repeated.

In this component-embedded module B, a sub-module substrate 11A having a multilayer structure as shown in FIG. 8 is used as a sub-module 10A. By forming inner-layer electrodes 19 inside the sub-module substrate 11A, capacitances or resistances can be formed inside the sub-module substrate 11A. Thus, a multifunctional sub-module 10A can be provided. In this case, as the material of the sub-module substrate 11A, a resin composition, a ceramic material, or other suitable material can preferably be used, for example. The integrated circuit element 15a and individual passive components 15b included in the second circuit components 15 are mounted on the upper surface of the sub-module substrate 11A. No resin layer 16 (see FIG. 3) is provided thereon. As with the first circuit components 7, the second circuit components 15 are embedded in the insulating resin layer 20.

In this component-embedded module B, the sub-module 10A does not include the resin layer 16. Therefore, the thickness of the sub-module 10A can be reduced accordingly. In particular, if the heights of the first circuit components 7 are relatively low, the heights of the first circuit components 7 and that of the sub-module 10A can be matched. Thus, the thickness of the module B can be further reduced.

Third Working Example

Figure 9:
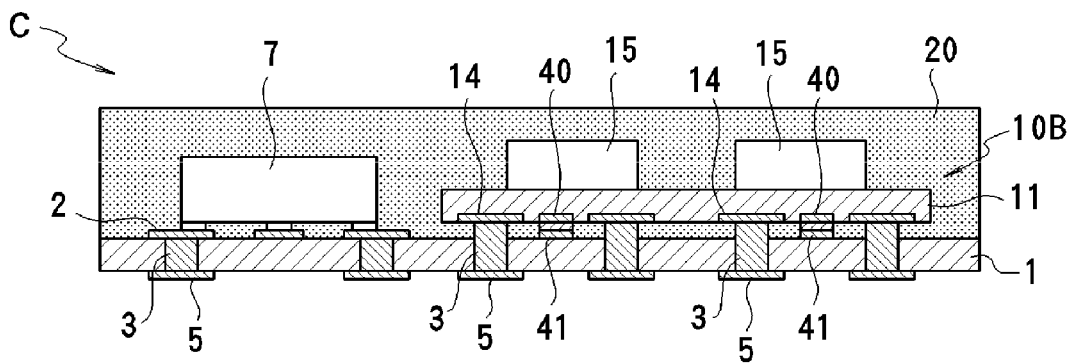
FIG. 9 is a sectional view of a working example another preferred embodiment of a component-embedded module according to the present invention.
Figure 10:
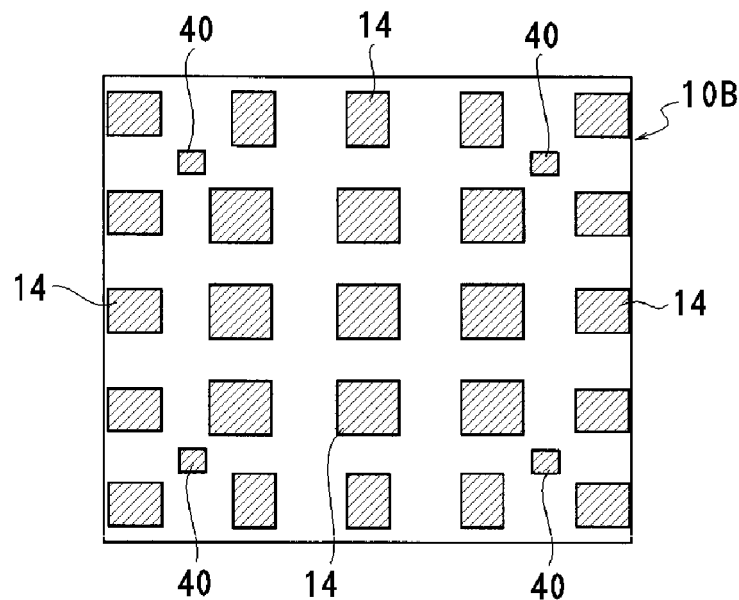
FIG. 10 is a drawing of the bottom surface of the sub-module of the component-embedded module shown in FIG. 9.
Figure 11:
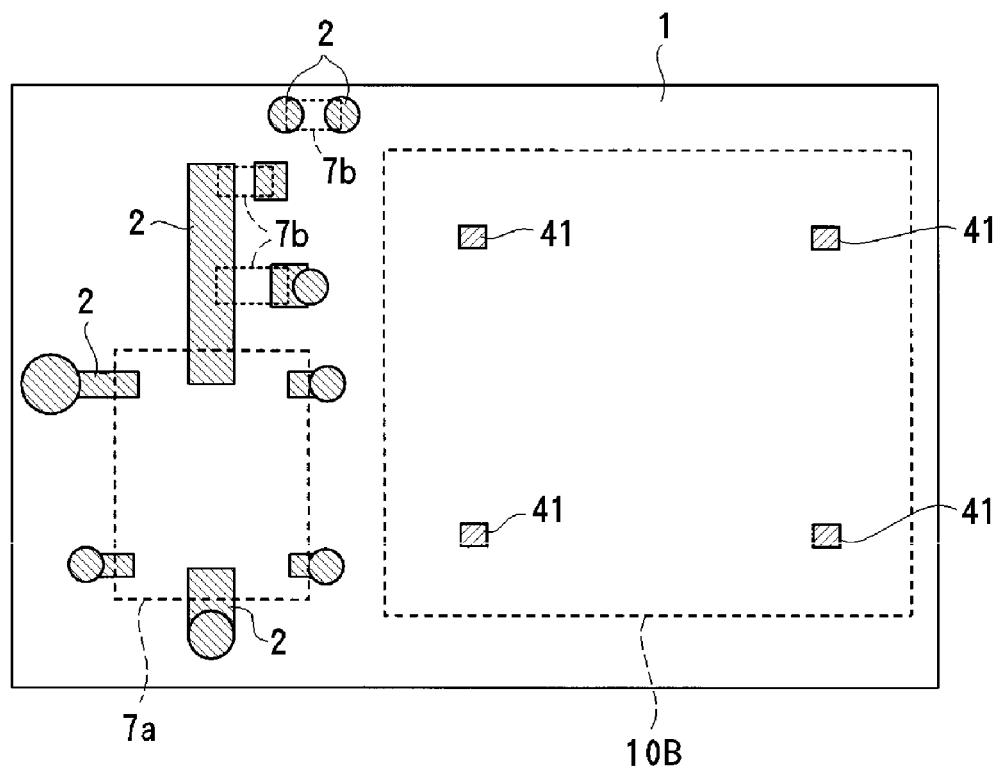
FIG. 11 is a plan view of a module substrate of the component-embedded module shown in FIG. 9.

FIGS. 9 to 11 show a third working example of a component-embedded module. This working example is intended to show another method for fixing a sub-module to a module substrate. Elements corresponding to those in the first working example are assigned the same reference numerals and descriptions thereof will not be repeated.

In this component-embedded module C, the terminal electrodes 14 are provided on the lower surface of a sub-module 10B in a matrix as shown in FIG. 10 and an appropriate number (here, four) of dummy electrodes 40 are preferably provided in gaps between the terminal electrodes 14. The dummy electrodes 40 are lands that are not associated with electrical coupling between the sub-module 10B and module substrate 1, and are provided independently of the terminal electrodes 14. The size, positions and the number of the dummy electrodes 40 are not particularly limited as long as they have no negative influence on the mountability or the electrical characteristics of the sub-module. As shown in FIG. 11, lands 41 for fixing a sub-module are provided on the module substrate 1 corresponding to the dummy electrodes 40. The lands 41 are lands that are not coupled to the via conductors 3 to be provided in a later step. The lands 41 for fixing a sub-module are subjected to Sn plating, as with the land portions of the wiring electrodes 2 for mounting the first circuit components 7 (7a, 7b). By mounting the sub-module 10B on the module substrate 1 together with the first circuit components 7 using Sn precoating, for example, the sub-module 10B can be fixed onto the module substrate 1. For this reason, a bonding sheet as shown in the first working example is not required in the third working example. The subsequent methods are substantially the same as those in FIGS. 6C to 6G. Note that the terminal electrodes 14 of the sub-module 10B do not always need to be disposed in a matrix as shown in FIG. 10 and may be disposed peripherally (peripheral disposition) or randomly.

In this working example, the sub-module 10B is fixed to the module substrate 1 using the dummy electrodes 40 and then the insulating resin layer 20 is provided such that the insulating resin layer 20 covers the sub-module 10B and first circuit components 7. While a narrow space is provided between the sub-module 10B and module substrate 1 unlike in FIGS. 6A to 6G, a resin is fluidized during formation of the insulating resin layer 20 such that the narrow space is also filled with the resin. Subsequently, the same steps as those in FIGS. 6D to 6G are performed. In FIG. 6F, the via holes are formed through the module substrate 1 and bonding sheet 32 such that the via holes extend to the terminal electrodes of the sub-module. In this working example, the bonding sheet 32 does not exist, and therefore, via holes are preferably formed such that the via holes extend through the insulating resin layer 20 located below the sub-module 10B and to the terminal electrodes 14 of the sub-module 10B. Therefore, the via conductors 3 are coupled to terminal electrodes 14 through the insulating resin layer 20.

If this method is used, the sub-module 10B can preferably be fixed to the module substrate 1 using the same Sn precoating construction method as that used to fix the first circuit components 7. That is, the first circuit components 7 and sub-module 10B can be collectively mounted. Therefore, the number of steps can be reduced. Also, by applying Sn precoating, the amount of solder is significantly reduced as compared to that in a case in which the sub-module is mounted on the module substrate by soldering. Also, the anti-solder flash capability is enhanced. Also, in order to perform solder mounting, a thickness of about 80 μm to about 100 μm, for example, is preferred since metal masks are formed on the lands 41 for fixing a sub-module and then a solder paste is formed. For Sn precoating, mounting can be performed by only performing Sn plating on the lands 41 for fixing a sub-module by a thickness of about 1 μm, for example. Therefore, the height of the entire component-embedded module can be reduced.

The present invention is not limited to the above-mentioned working examples of preferred embodiments. While examples in which one sub-module is mounted on a module substrate are shown in the above-mentioned working examples, multiple sub-modules may be mounted on a module substrate. In this case, the multiple sub-modules may preferably be mounted at intervals and the first circuit components may be mounted in the intermediate positions between the sub-modules. In this case, the sub-modules are disposed on both sides of the first circuit components 7. Therefore, the strength of the module substrate against warpage and the strength thereof against shock are improved. If multiple sub-modules are mounted, it is not necessary to mount an integrated circuit element on each of the sub-modules or embed an integrated circuit element in each sub-module, and only passive components similar to the first circuit components may be mounted on each sub-module.

In the above-described working examples, as the sub-module, a sub-module formed by mounting the second circuit components on a sub-module substrate having a single-layer structure or a multilayer structure, or a sub-module formed by mounting the second circuit components on a sub-module substrate and then forming a resin layer on the second circuit components is used. However, the sub-module may be formed using only a resin layer without including a sub-module substrate. In this case, the sub-module manufacturing methods may be substantially the same as those shown in FIGS. 4A to 4E. In the above-mentioned working examples, an example in which a sub-module is formed using a component-embedded substrate and an example in which a sub-module is formed by mounting the second circuit components on a sub-module substrate are shown. However, a sub-module substrate of a sub-module may be formed using a component-embedded substrate and the second circuit components may be mounted on the upper surface of the component-embedded substrate.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A component-embedded module comprising:
a module substrate having a wiring pattern on each of an upper surface thereof and a lower surface thereof and having a via conductor or a through hole conductor extending therethrough, the via conductor or the through hole extending from the wiring pattern on the lower surface to the wiring pattern upper surface;
a first circuit component mounted on the wiring pattern on the upper surface of the module substrate;
a sub-module having an area thereof that is less than an area of the module substrate, the sub-module having a terminal electrode on a lower surface thereof, the sub-module being disposed on an area of the upper surface of the module substrate, the area being an area on which the wiring pattern is not provided;
a second circuit component mounted on the sub-module and/or embedded in the sub-module; and
an insulating resin layer provided on substantially the entire upper surface of the module substrate such that the insulating resin layer covers at least a portion of the first circuit component and the sub-module; wherein
the terminal electrode of the sub-module is directly coupled to the via conductor or the through hole conductor extending through the module substrate.

2. The component-embedded module according to claim 1, wherein a lower surface of the sub-module is bonded to the upper surface of the module substrate via a bonding sheet, and the via conductor or the through hole conductor extends through the bonding sheet.

3. The component-embedded module according to claim 2, wherein the bonding sheet is made of a material identical to or substantially identical to a material of the insulating resin layer.

4. The component-embedded module according to claim 1, wherein a perimeter of the sub-module is positioned using a resist pattern provided on the upper surface of the module substrate.

5. The component-embedded module according to claim 1, wherein a fixing land precoated with Sn is provided on the area on the upper surface of the module substrate on which the wiring pattern is not formed, a dummy electrode is provided on a lower surface of the sub-module independently of the terminal electrode, and the dummy electrode is mounted on the fixing land using precoating.

6. The component-embedded module according to claim 1, wherein the second circuit component includes an integrated circuit element having a plurality of terminals.

7. The component-embedded module according to claim 6, wherein the first circuit component is an individual circuit component having a number of terminals less than the plurality of terminals of the integrated circuit element.

8. The component-embedded module according to claim 1, wherein the first circuit component includes a circuit component having a height higher than a height of the second circuit component.

9. The component-embedded module according to claim 1, wherein a shield layer is provided on an upper surface of the insulating resin layer, a ground electrode is provided on one of an upper surface of the sub-module and the upper surface of the module substrate, and a via conductor coupling the shield layer and the ground electrode is provided through the insulating resin layer.

10. A component-embedded module manufacturing method comprising:
a first step of forming a wiring pattern on a support plate;
a second step of mounting a first circuit component on the wiring pattern;
a third step of disposing a sub-module on an area on the support plate, the area being an area on which the wiring pattern is not formed, the sub-module having a terminal electrode on a lower surface thereof, the sub-module having a second circuit component embedded therein or mounted thereon;
a fourth step of forming an insulating resin layer on the support plate such that the insulating resin layer covers at least a portion of the first circuit component and the sub-module;
a fifth step of peeling off the support plate from the wiring pattern, the sub-module, and the insulating resin layer;
a sixth step of laminating a module substrate on the wiring pattern, the sub-module, and the insulating resin layer; and
a seventh step of forming a via conductor or a through hole conductor through the module substrate such that the via conductor or the through hole conductor makes contact with the terminal electrode of the sub-module.

11. The component-embedded module manufacturing method according to claim 10, wherein in the sixth step, the module substrate is laminated in a semi-cured state.

12. The component-embedded module manufacturing method according to claim 10, wherein in the third step, the module substrate is bonded onto the support plate using a bonding sheet.

13. The component-embedded module manufacturing method according to claim 12, wherein the bonding sheet is a resin sheet made of a material identical to or substantially identical to a material of the insulating resin layer.

14. The component-embedded module manufacturing method according to claim 10, wherein in the third step, a perimeter of the sub-module is positioned by forming a resist pattern on the support plate and disposing the sub-module using the resist pattern as a guide.

15. The component-embedded module manufacturing method according to claim 10, wherein a fixing land precoated with Sn is formed on an area on the support plate, the area being an area on which the wiring pattern is not formed, a dummy electrode is formed on a lower surface of the sub-module independently of the terminal electrode, and the dummy electrode is mounted on the fixing land using precoating at the same time that the first circuit component is mounted on the wiring pattern using precoating.

16. A component-embedded module manufacturing method comprising:
a first step of preparing a semi-cured module substrate having a wiring pattern formed on an upper surface thereof;
a second step of mounting a first circuit component on the wiring pattern;

a third step of disposing a sub-module on an area on the module substrate, the area being an area on which the wiring pattern is not formed, the sub-module being formed such that an area thereof is less than an area of the module substrate, the sub-module having a terminal electrode on a lower surface thereof, the sub-module having a second circuit component embedded therein and/or mounted thereon;

a fourth step of forming an insulating resin layer on the module substrate such that the insulating resin layer covers at least a portion of the first circuit component and the sub-module; and a fifth step of forming one of a via conductor and a through hole conductor, the via conductor and the through hole extending from the lower surface of the module substrate to the terminal electrode on the lower surface of the sub-module.

17. The component-embedded module manufacturing method according to claim 16, wherein the second to fourth steps are performed in a state in which the module substrate is fixed to a reinforcing plate.

* * * * *